(12) United States Patent
Lee et al.

(10) Patent No.: US 10,008,685 B2
(45) Date of Patent: Jun. 26, 2018

(54) ORGANIC LIGHT EMITTING DEVICE AND MANUFACTURING METHOD THEREOF

(71) Applicants: SAMSUNG DISPLAY CO., LTD., Yongin, Gyeonggi-Do (KR); POSTECH ACADEMY-INDUSTRY FOUNDATION, Pohang-si, Gyeongsangbuk-do (KR)

(72) Inventors: Tae-Woo Lee, Pohang-si (KR); Su-Hun Jeong, Busan (KR); Kwanhee Lee, Suwon-si (KR); Wonjun Song, Hwaseong-si (KR)

(73) Assignees: Samsung Dispaly Co., Ltd., Yongin, Gyeonggi-do (KR); Postech Academy-Industry Foundation, Pohang-Si, Gyeongsangbuk-do (KR)

( * ) Notice: Subject to any disclaimer, the term of this patent is extended or adjusted under 35 U.S.C. 154(b) by 357 days.

(21) Appl. No.: 14/812,493

(22) Filed: Jul. 29, 2015

(65) Prior Publication Data

US 2016/0035995 A1 Feb. 4, 2016

(30) Foreign Application Priority Data

Jul. 30, 2014 (KR) ........................ 10-2014-0097474

(51) Int. Cl.
*H01L 51/50* (2006.01)
*H01L 51/52* (2006.01)
*H01L 51/00* (2006.01)

(52) U.S. Cl.
CPC ...... *H01L 51/5206* (2013.01); *H01L 51/0037* (2013.01); *H01L 2251/5346* (2013.01); *H01L 2251/5369* (2013.01)

(58) Field of Classification Search
None
See application file for complete search history.

(56) References Cited

U.S. PATENT DOCUMENTS

| 7,811,477 | B2 | 10/2010 | Lee et al. |
| 8,004,177 | B2 | 8/2011 | Lee et al. |
| 2007/0069199 | A1 | 3/2007 | Choulis et al. |
| 2009/0236979 | A1 | 9/2009 | Han-Adebekun et al. |
| 2011/0309347 | A1* | 12/2011 | Okada ................. H01L 51/5206 257/40 |

FOREIGN PATENT DOCUMENTS

| JP | 2013-102101 A | 5/2013 |
| KR | 10-1092639 B1 | 12/2011 |
| KR | 10-1135857 B1 | 4/2012 |

(Continued)

OTHER PUBLICATIONS

Lee et al., Layer by Layer Spin Self-Assembled Hole Injedtion Layers Containing a Perfluorinated Ionomer for Efficient Polymer Light-Emitting Diodes, 2007, Macromolecular Rapid Communications, vol. 28, pp. 1366-1372.*

(Continued)

*Primary Examiner* — Gregory D Clark
(74) *Attorney, Agent, or Firm* — Lee & Morse, P.C.

(57) ABSTRACT

An organic light emitting device includes an anode, the anode including a conductive polymer, a fluorine-containing organic material, and metal nanoparticles, a cathode facing the anode, and an emission layer between the anode and the cathode.

16 Claims, 12 Drawing Sheets

(56) References Cited

FOREIGN PATENT DOCUMENTS

| | | |
|---|---|---|
| KR | 10-2013-0126957 A | 11/2013 |
| KR | 10-1342467 B1 | 12/2013 |
| KR | 10-1389987 B1 | 4/2014 |

OTHER PUBLICATIONS

Harry A. Atwater, et al., "Plasmonics for improved photovoltaic devices", Nature Materials, vol. 9, Mar. 2010, pp. 205-213.
Kajii, et al., "Organic Light-Emitting Diodes with Highly Conductive Polymer Electrodes as Anode and Their Stress Tolerance," Japanese Journal of Applied Physics. vol. 47, No. 1, 2008, pp. 460-463.

\* cited by examiner

ORGANIC LIGHT EMITTING DEVICE AND MANUFACTURING METHOD THEREOF

CROSS-REFERENCE TO RELATED APPLICATION

Korean Patent Application No. 10-2014-0097474, filed on Jul. 30, 2014, in the Korean Intellectual Property Office, and entitled: "Organic Light Emitting Device and Manufacturing Method Thereof," is incorporated by reference herein in its entirety.

BACKGROUND

1. Field

The present disclosure herein relates to an organic light emitting device and a manufacturing method thereof.

2. Description of the Related Art

Flat display devices may be largely classified as a light emitting type device and a light receiving type device. The light emitting type device includes a cathode ray tube, a plasma display panel, an electro luminescent device, etc. The light receiving type device may include a liquid crystal display. The electro luminescent device may have merits such as wide viewing angles, excellent contrast, and rapid response time, and is of interest as a next generation display device. The electro luminescent device may be an inorganic electro luminescent device or an organic electro luminescent device according to the material forming an emission layer.

The organic electroluminescent device emits light through the electrical excitation of a fluorescent organic compound, and may be employed for a display. The organic electroluminescent display is of interest as a next generation display device, and may solve the limitations of a liquid crystal display and realize driving at a low voltage, a thin panel, wide viewing angles, rapid response time, etc.

SUMMARY

Embodiments are directed to an organic light emitting device, including an anode, the anode including a conductive polymer, a fluorine-containing organic material, and metal nanoparticles, a cathode facing the anode, and an emission layer between the anode and the cathode.

Concentration of the fluorine-containing organic material in the anode may increase toward the emission layer.

The fluorine-containing organic material may include a moiety represented by the following Formula 1:

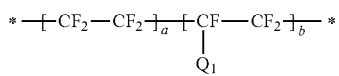

[Formula 1]

wherein:
a may be a number from 0 to 10,000,000;
b may be a number from 1 to 10,000,000;
$Q_1$ may be $[O—C(R_1)(R_2)—C(R_3)(R_4)]_c$—$[OCF_2CF_2]_d$—$R_5$, —COOH, or —O—$R_f$—$R_6$;
$R_1$, $R_2$, $R_3$, and $R_4$ may independently be —F, —$CF_3$, —$CHF_2$, or —$CH_2F$;
c and d may independently be a number from 0 to 20;
$R_f$ may be —$(CF_2)_z$— (where z is an integer from 1 to 50) or —$(CF_2CF_2O)_z$—$CF_2CF_2$- (where z is an integer from 1 to 50);
$R_5$ and $R_6$ may independently be —$SO_3M$, —$PO_3M$, or —$CO_2M$; and
M may represent $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

The fluorine-containing organic material may include a moiety represented by the following Formula 2:

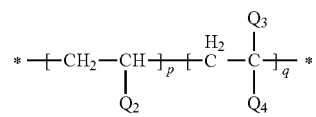

[Formula 2]

wherein:
p may be a number from 0 to 10,000,000;
q may be a number from 1 to 10,000,000;
$Q_2$ may be hydrogen, a substituted or unsubstituted $C_6$-$C_{60}$ aryl group, or —COOH;
$Q_3$ may be hydrogen, or a substituted or unsubstituted $C_1$-$C_{20}$ alkyl group;
$Q_4$ may be —O—$(CF_2)_r$—$SO_3M$, —O—$(CF_2)_r$—$PO_3M_2$, —O—$(CF_2)_r$—$CO_2M$, or —CO—NH—$(CH_2)_s$—$(CF_2)_t$—$CF_3$;
r, s, and t may independently be a number from 0 to 20; and
M may represent $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

The fluorine-containing organic material may include a moiety represented by the following Formula 3:

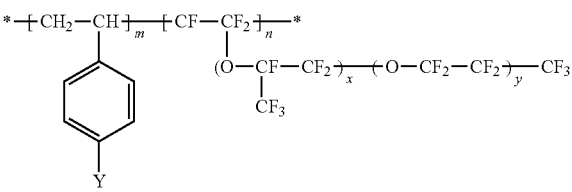

[Formula 3]

wherein:
m may be a number from 0 to 10,000,000;
n may be a number from 1 to 10,000,000;
x may be a number from 0 to 20;
y may be a number from 0 to 20;
Y may be —$SO_3M$, —$PO_3M$, or —$CO_2M$; and
M may represent $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

The fluorine-containing organic material may be represented by the following Formula 4:

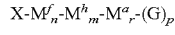

[Formula 4]

wherein:
X may be a terminal group;
$M^f$ may represent a unit derived from a fluorinated monomer obtained through condensation reaction of perfluoropolyether alcohol, polyisocyanate, and isocyanate reactive-non-fluorinated monomer, or a fluorinated $C_{1-20}$ alkylene group;

$M^h$ may represent a unit derived from a non-fluorinated monomer;

$M^a$ may represent a unit having a silyl group represented by —$Si(Y_4)(Y_5)(Y_6)$;

$Y_4$, $Y_5$, and $Y_6$ may independently be a halogen atom, a substituted or unsubstituted $C_1$-$C_{20}$ alkyl group, a substituted or unsubstituted $C_6$-$C_{30}$ aryl group, or a hydrolysable substituent, at least one of $Y_4$, $Y_5$, and $Y_6$ being the hydrolysable substituent;

G may be an organic group including a chain transfer agent residue;

n may be a number from 1 to 100;

m may be a number from 1 to 100;

r may be a number from 1 to 100; and p may be a number from 0 to 10.

The conductive polymer may include one or more of polythiophene, polyaniline, polypyrrole, polystyrene, sulfonated polystyrene, poly(3,4-ethylenedioxythiophene), a self-doping conductive polymer, a derivative thereof, or a combination thereof.

The metal nanoparticles may be homogeneously dispersed in the anode.

The metal nanoparticles may be provided to make contact with an interface of the anode far from the emission layer.

The metal nanoparticles may include one or more of Au, Ag, Cu, Pt, Pd, Ru, or Re nanoparticles.

The metal nanoparticles may have a size from about 5 to about 50 nm.

The metal nanoparticles may have a sphere shape, a cube shape, a plate shape, or a cage shape.

The anode may include an electrode part including a transparent conductive material, and a hole injection part provided between the electrode part and the emission layer.

The hole injection part may include the metal nanoparticles, the conductive polymer, and the fluorine-containing organic material.

The metal nanoparticles may be homogeneously dispersed in the hole injection part.

The metal nanoparticles may be provided at an interface of the hole injection part adjacent to the anode.

Embodiments are also directed to a manufacturing method of an organic light emitting device, the method including forming an anode including metal nanoparticles, a conductive polymer, and a fluorine-containing organic material on a substrate, forming an emission layer on the anode, and forming a cathode on the emission layer.

The forming of the anode may include applying a mixture solution that includes the metal nanoparticles, the conductive polymer, and the fluorine-containing organic material on the substrate, and conducting micro-phase separation of the conductive polymer and the fluorine-containing organic material.

The forming of the anode may include applying the metal nanoparticles on the substrate, applying a mixture solution that includes the conductive polymer, and the fluorine-containing organic material on the substrate, and conducting micro-phase separation of the conductive polymer and the fluorine-containing organic material.

The forming of the anode may include forming an electrode part using a transparent conductive material, and forming a hole injection part using the metal nanoparticles, the conductive polymer, and the fluorine-containing organic material.

BRIEF DESCRIPTION OF THE DRAWINGS

Features will become apparent to those of skill in the art by describing in detail example embodiments with reference to the attached drawings in which.

DETAILED DESCRIPTION

Figure 1:
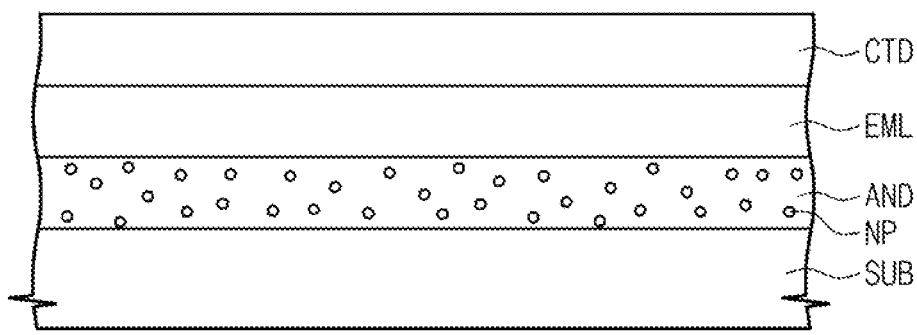
FIG. 1 illustrates a cross-sectional view of an organic light emitting device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are only used to distinguish one element from another element. Thus, a first element discussed below could be termed a second element. Similarly, a second element could be termed as a first element. As used herein, the singular forms are intended to include the plural forms as well, unless the context clearly indicates otherwise.

It will be further understood that the terms "comprises" and/or "comprising," when used in this specification, specify the presence of stated features, steps, operations, and/or devices, but do not preclude the presence or addition of one or more other features, steps, operations, and/or devices thereof. It will also be understood that when a layer (or film) is referred to as being 'on' another layer or substrate, it can be directly on the other layer or substrate, or intervening layers may also be present. It will also be understood that when a layer (or film) is referred to as being 'under' another layer or substrate, it can be directly under the other layer or substrate, or intervening layers may also be present.

FIG. 1 illustrates a cross-sectional view of an organic light emitting device according to an example embodiment.

Referring to FIG. 1, an organic light emitting device according to an example embodiment includes a substrate SUB, an anode AND provided on the substrate SUB, an emission layer EML provided on the anode AND, and a cathode CTD provided on the emission layer EML.

The substrate SUB may be an insulating substrate formed by using glass, crystal, an organic polymer, etc. As the organic polymer forming the substrate SUB, polyethylene terephthalate (PET), polyethylene naphthalate (PEN), polyimide, polyethersulfone, etc. may be used. The material for the substrate SUB may be selected in consideration of mechanical strength, thermal stability, transparency, surface smoothness, availability of handling, water resistance, etc.

The anode AND is provided on the substrate SUB and has conductivity.

The anode AND includes a conductive polymer, a fluorine-containing organic material, and metal nanoparticles. The anode AND will be described hereinafter.

On the anode AND, the emission layer EML is provided.

The emission layer EML may use at least one material of emission materials, and the emission material may include both host and dopant.

In an example embodiment, the host may include one or more of, for example, tris(8-quinolinonato)aluminum (Alq3), 4,4'-bis(N-carbazolyl)-1,1'-biphenyl (CBP), poly(n-vinylcarbazole (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), etc.

In an example embodiment, various dopants such as fluorescent dopant or phosphorescent dopant may be used as the dopant. The phosphorescent dopant may be an organo metal complex including one or more of, for example, Ir, Pt, Os, Re, Ti, Zr, Hf, or a combination of at least two thereof. In an example embodiment, red dopant may include one or more of, for example, Pt(II) octaethylporphine (PtOEP), tris(2-phenylisoquinoline)iridium (Ir(piq)3, bis(2-(2'-benzothienyl)-pyridinato-N,C3')iridium(acetylacetonate) (Btp2Ir(acac)), etc. In an example embodiment, green dopant may include one or more of, for example, tris(2-phenylpyridine) iridium (Ir(ppy)₃), bis(2-phenylpyridine(acetylacetonato) iridium(III) (Ir(ppy)₂(acac)), tris(2-(4-tolyl)phenylpyridine) iridium (Ir(mppy)₃, 10-(2-benzothiazolyl)-1,1,7,7-tetramethyl-2,3,6,7-tetrahydro-1H,5H,11H-[1]benzopyrano [6,7,8-ij]-quinolizin-11-one (C545T), etc. In an example embodiment, blue dopant may include one or more of, for example, bis[3,5-difluoro-2-(2-pyridyl)phenyl](picolinato) iridium(III) (F2Irpic), (F2ppy)₂Ir(tmd), Ir(dfppz)₃, 4,4'-bis (2,2'-diphenylethen-1-yl)biphenyl (DPVBi), 4,4'-bis[4-(diphenylamino)styryl]biphenyl (DPAVBi), 2,5,8,11-tetra-tert-butylperylene (TBPe), etc.

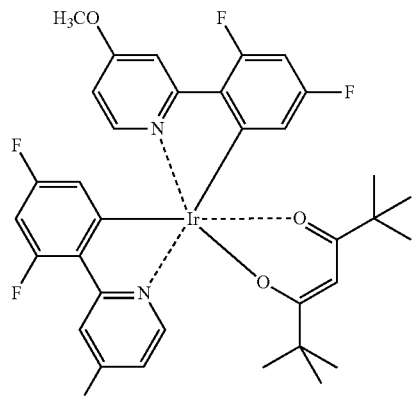

(F2ppy)₂Ir(tmd)

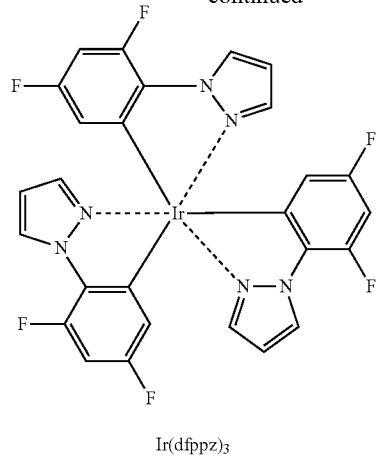

Ir(dfppz)₃

In an example embodiment, in the case that the emission layer EML includes the host and the dopant, the amount of the dopant may be selected in the range from, for example, about 0.01 to about 15 parts by weight with respect to 100 parts by weight of the host.

In an example embodiment, the thickness of the emission layer EML may be from, for example, about 100 Å to about 1,000 Å, or from about 200 Å to about 600 Å. The thickness of the emission layer EML may be determined according to the kind of the materials or the structure of a device.

In an example embodiment, the emission layer EML may be formed by using a method such as a vacuum deposition method, a spin coating method, a cast method, a Langmuir-Blodgett (LB) method, etc.

The cathode CTD may be formed by using, for example, a metal or an alloy having low work function, an electrically conductive compound, or a mixture thereof. For example, the cathode CTD may be formed by using one or more of lithium (Li), magnesium (Mg), aluminum (Al), aluminum-lithium (Al—Li), calcium (Ca), magnesium-indium (Mg—In), magnesium-silver (Mg—Ag), etc.

In the organic light emitting device having the above-described structure, voltages are applied to the anode AND and the cathode CTD, respectively, and holes injected from the anode AND move to the emission layer EML, and electrons injected from the cathode CTD move to the emission layer EML. The electrons and the holes are recombined in the emission layer EML to produce excitons. Light may be emitted through the dropping of the excitons from an excited state to a ground state.

Referring to FIG. 1 again, the anode AND will be described in detail.

As described above, the anode AND includes a conductive polymer, a fluorine-containing organic material, and metal nanoparticles NP. The fluorine-containing organic material may be, for example, a fluoropolymer.

According to the present example embodiment, the conductive polymer and the fluoropolymer are in a micro-phase separation state. The conductive polymer is mainly disposed toward the substrate SUB rather than the emission layer EML, and the fluoropolymer is disposed toward the emission layer EML rather than the substrate SUB. That is, the concentration of the conductive polymer in the anode increases toward the substrate SUB, and the concentration of the fluoropolymer in the anode increases toward the emission layer.

The anode AND includes the conductive polymer and functions as an electrode with conductivity.

The conductive polymer may include one or more of, for example, polythiophene, polyaniline, polypyrrole, polystyrene, sulfonated polystyrene, poly(3,4-ethylenedioxythiophene), a self-doping conductive polymer, derivatives thereof, or a combination thereof. In an example embodiment, the conductive polymer may include one or more of poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate (PANI/PSS), etc. The self-doping conductive polymer may be at least one compound among the following compounds.

[Formulae]

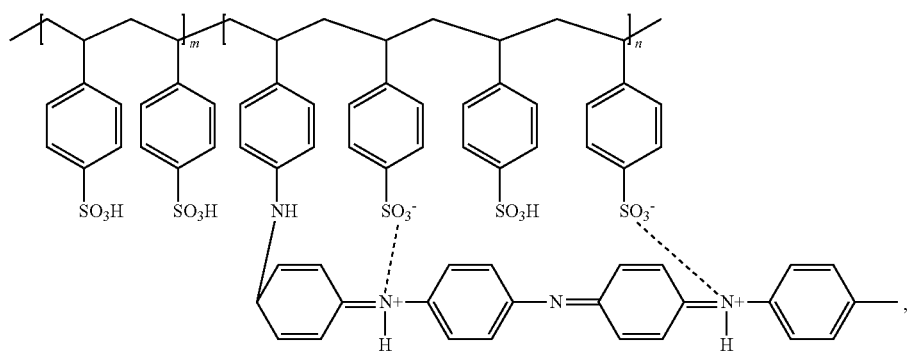

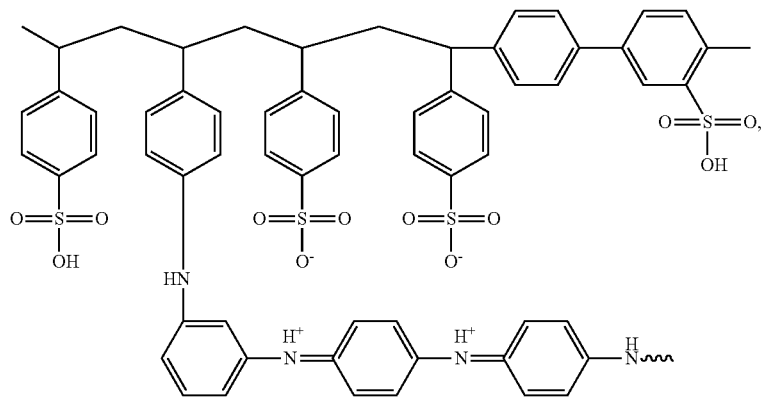

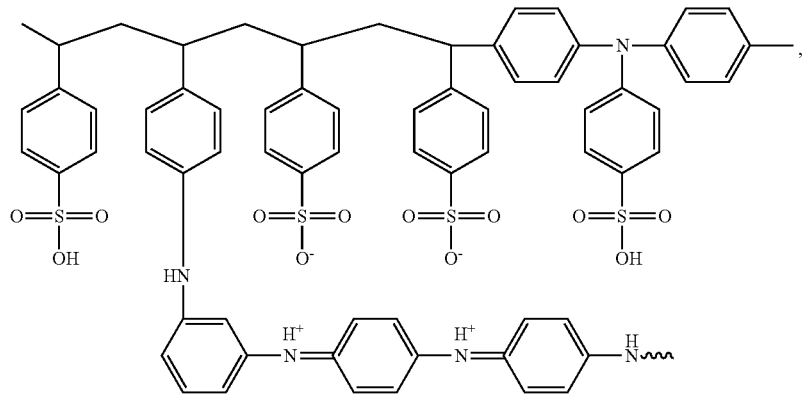

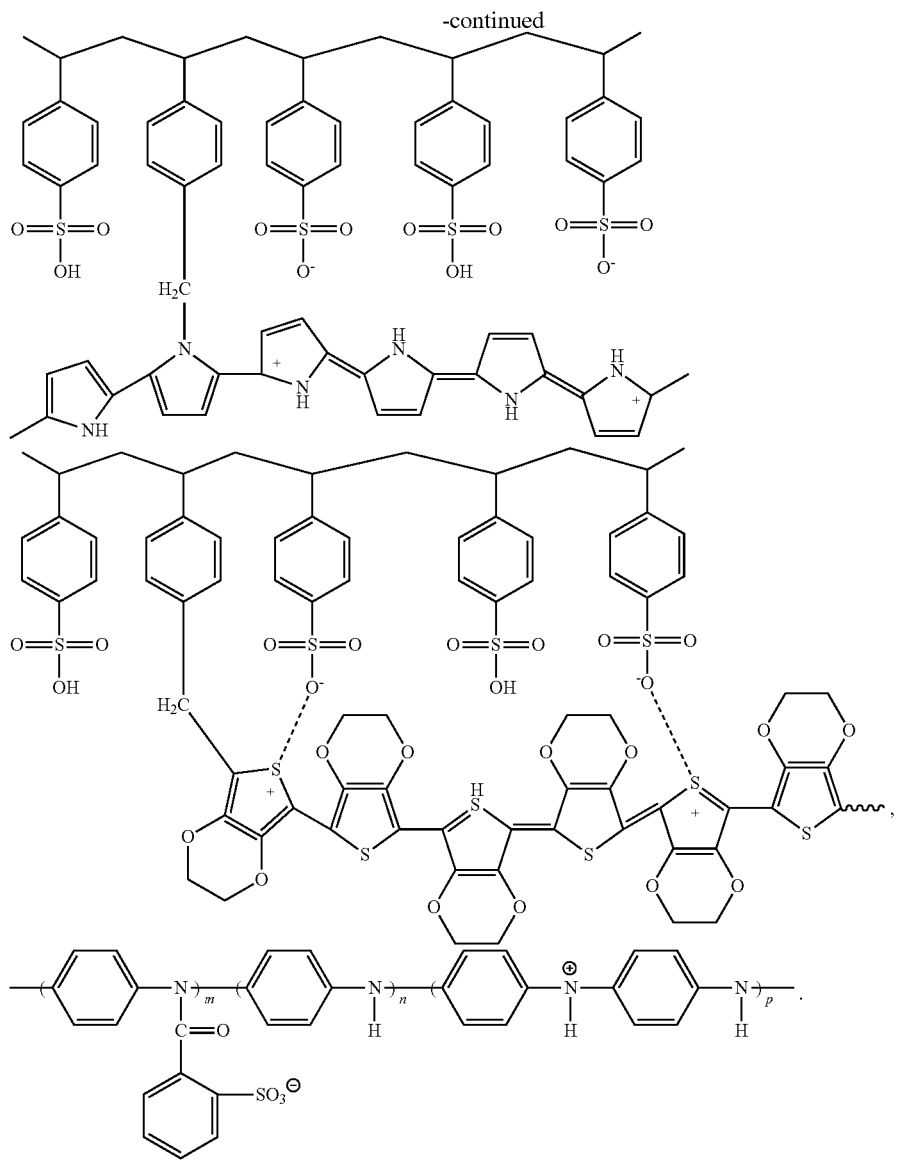

where m, n, and p are independently a number from 1 to 10,000,000.

According to an example embodiment, the fluoropolymer is a material having high work function and high ionization energy, and the work function of the anode AND increases in order according to the concentration gradient of the fluoropolymer.

The fluoropolymer may include one or more of the following Formulae 1 to 4.

[Formula 1]
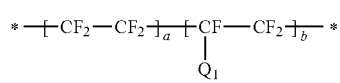

In Formula 1,
a may be a number from 0 to 10,000,000;
b may be a number from 1 to 10,000,000;
$Q_1$ may be $—[O—C(R_1)(R_2)—C(R_3)(R_4)]_c—[OCF_2CF_2]_d—R_5$, $—COOH$, or $—O—R_f—R_6$;

$R_1$, $R_2$, $R_3$, and $R_4$ may independently be $—F$, $—CH_3$, $—CHF_2$, or $—CH_2F$;

c and d may independently be a number from 0 to 20;

$R_f$ may be $—(CF_2)_z—$ (where z is an integer from 1 to 50) or $—(CF_2CF_2O)_z—CF_2CF_2—$ (where z is an integer from 1 to 50);

$R_5$ and $R_6$ may independently be $—SO_3M$, $—PO_3M$, or $—CO_2M$; and

M may represent $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

[Formula 2]
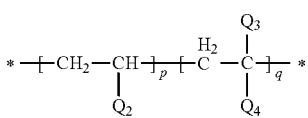

In Formula 2, p may be a number from 0 to 10,000,000;

q may be a number from 1 to 10,000,000;

$Q_2$ may be hydrogen, a substituted or unsubstituted $C_6$-$C_{60}$ aryl group, or —COOH;

$Q_3$ may be hydrogen, or a substituted or unsubstituted $C_1$-$C_{20}$ alkyl group;

$Q_4$ may be —O—$(CF_2)_r$—$SO_3M$, —O—$(CF_2)_r$—$PO_3M_2$, —O—$(CF_2)_r$—$CO_2M$, or —CO—NH—$(CH_2)_s$—$(CF_2)_t$—$CF_3$;

r, s, and t may independently be a number from 0 to 20; and

M may represent $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

[Formula 3]

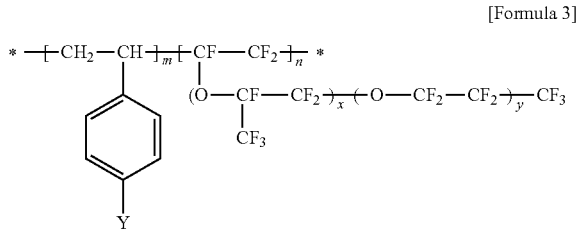

In Formula 3, m and n may satisfy 0≤m<10,000,000 and 0<n≤10,000,000;

x and y may independently be a number from 0 to 20;

Y may be —$SO_3M$, —$PO_3M$, or —$CO_2M$; and

M may represent $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

$$X-M^f_n\text{-}M^h_m\text{-}M^a_r\text{-}(G)_p \quad \text{[Formula 4]}$$

In Formula 4,

X may be a terminal group such as a halogen atom;

$M^f$ may represent a fluorinated $C_{1-20}$ alkylene group;

$M^h$ may represent a unit derived from a non-fluorinated monomer; for example, $M^h$ may be a $C_2$-$C_{20}$ alkylene group;

$M^a$ may represent a unit having a silyl group represented by —$Si(Y_4)(Y_5)(Y_6)$;

$Y_4$, $Y_5$ and $Y_6$ may independently be a halogen atom (Br, Cl, F, etc.), a substituted or unsubstituted $C_1$-$C_{20}$ alkyl group, a substituted or unsubstituted $C_6$-$C_{30}$ aryl group, or a hydrolysable substituent; one or more of $Y_4$, $Y_5$, and $Y_6$ may be a hydrolysable substituent;

G may be a monovalent organic group including a chain transfer agent residue which comprises a halocarbon such as carbon tetrachloride, or a thiol such as dodecyl mercaptan;

In an implementation, n+m+r may be at least 2; for example, in an implementation, n may be a number from 1 to 100, m may be a number from 1 to 100, and r may be a number from 1 to 100;

p may be a number from 0 to 10.

In an example embodiment, the fluorinated silane-based material represented by the above Formula 4 may be $CF_3CH_2CH_2SiCl_3$, etc.

Metal nanoparticles NP may be metal particles having a size from, for example, about 5 nanometers to about 50 nanometers. The metal nanoparticles according to an example embodiment may include one or more of Au, Ag, Cu, Pt, Pd, Ru, or Re nanoparticles. The metal nanoparticles NP may have various shapes, for example, a sphere shape, a non-hollow cube shape, a plate shape, a hollow cage shape, etc.

In an example embodiment, the metal nanoparticles NP may be homogeneously dispersed in the anode AND.

According to an example embodiment, in the metal nanoparticles NP, electrons in the metal nanoparticles NP exhibit collective oscillation with incident light, and strong absorbance may be shown in a specific wavelength range. The metal nanoparticles NP may scatter light at the emission layer EML, and so a light extracting effect may be increased. In addition, the metal nanoparticles NP may amplify light in a specific wavelength range through surface Plasmon resonance effect, and light efficiency may be increased.

The anode AND may be formed on the substrate SUB using a solution including the conductive polymer, the fluoropolymer, the metal nanoparticles NP, and a solvent by various methods such as coating. The solvent may be a suitable solvent that provides the conductive polymer, the fluoropolymer, and the metal nanoparticles NP in a solution state.

Then, the solvent may be removed by drying, evaporation, etc.

According to an example embodiment, the conductive polymer is a relatively polar and hydrophilic material, whereas the fluoropolymer is a relatively nonpolar and hydrophobic material. In the case that the anode AND is formed by using the solution, the conductive polymer and the fluoropolymer may undergo micro-phase separation with the removal of the solvent.

In an example embodiment, a dopant may be added to increase the electroconductivity of the conductive polymer. The dopant may be, for example, dimethyl sulfoxide (DMSO). The DMSO has a blocking effect of counter ions in the conductive polymer and charge carriers. For example, in the case that PEDOT:PSS is used as the conductive polymer, coulomb interaction between positively charged PEDOT and negatively charged PSS dopant may be decreased.

Since the DMSO is relatively polar, the DMSO is positioned toward the conductive polymer side and increases the electroconductivity of the conductive polymer.

The organic light emitting device having the above-described structure may be manufactured by forming the anode AND including the metal nanoparticles NP, the conductive polymer, and the fluoropolymer on the substrate SUB, forming the emission layer EML on the anode AND, and forming the cathode CTD on the emission layer EML.

The anode AND may be formed by applying a mixture solution of the metal nanoparticles NP, the conductive polymer, and the fluoropolymer on the substrate SUB and performing the micro-phase separation of the conductive polymer and the fluoropolymer.

In the organic light emitting device having the above-described structure, the density of the conductive polymer in the anode AND increases gradually toward the substrate SUB, and the density of the fluoropolymer increases gradually toward the emission layer EML. Since the fluoropolymer is a material having relatively high work function when compared to the conductive polymer, the work function of the anode AND may increase gradually from the substrate SUB to the emission layer EML. The work function of the anode AND is dependent on the kind of the fluoropolymer, however may increase to at most about 5.8 eV.

Figure 2A:
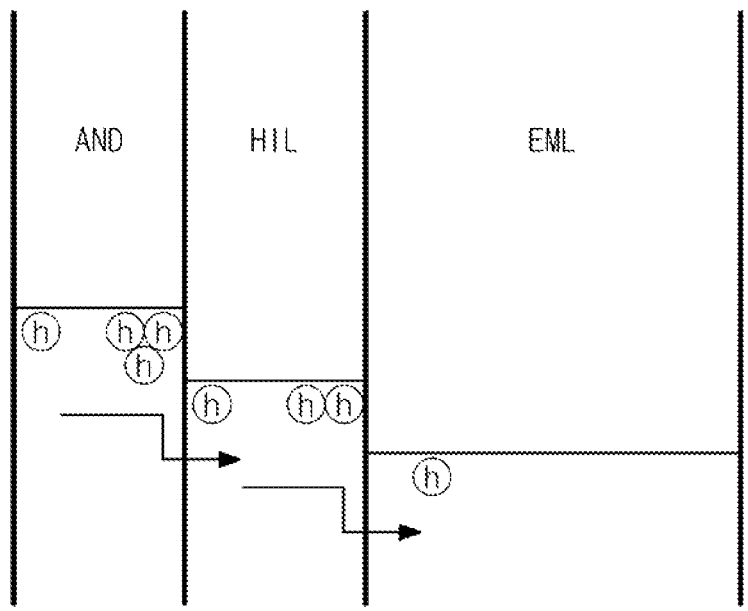
FIGS. 2A and 2B illustrate diagrams of HOMO levels between an anode and an emission layer according to a general method and an example embodiment, respectively.
Figure 2B:
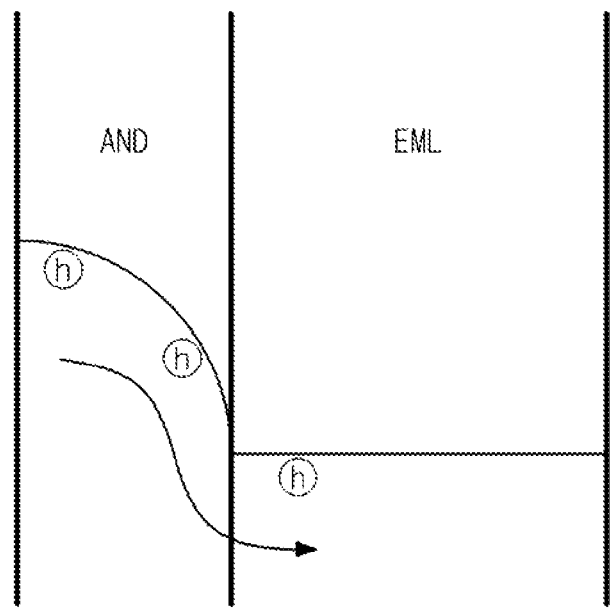

FIGS. 2A and 2B are diagrams respectively illustrating highest occupied molecular orbital (HOMO) level between an anode AND and an emission layer EML according to a general method and an example embodiment.

Referring to FIG. 2A, a general organic light emitting device includes an anode AND, a hole injection layer HIL, and an emission layer EML stacked sequentially. According to the work function of each of the materials composing the anode AND, the hole injection layer HIL, and the emission layer EML, a step of HOMO levels at the interface between the anode AND and the hole injection layer HIL, and a step of HOMO levels at the interface between the hole injection layer HIL and the emission layer EML are present. Thus, holes may be injected into the emission layer EML when jumping an energy barrier corresponding to the difference of the HOMO levels at the two interfaces. For reference, the HOMO level of a material, PEDOT:PSS, used as the material of the hole injection layer HIL of the general organic light emitting device is about 5.0 eV and does not reach to the HOMO level of a general hole transport layer or emission layer EML (from about 5.4 eV to about 5.8 eV). Thus, the difference of the energy levels may function as an obstacle to the hole injection. That is, the HOMO level of the hole injection layer HIL does not reach the HOMO level of the hole transport layer or the emission layer EML (from about 5.4 eV to about 5.8 eV), and the difference thereof may function as an obstacle of the hole injection.

Referring to FIG. 2B, in the organic light emitting device according to an example embodiment, the concentration of the conductive polymer gradually decreases, and the concentration of the fluoropolymer gradually increases toward the emission layer EML in the anode AND. Since the fluoropolymer is a material having relatively high work function when compared to the conductive polymer, the work function of the anode AND may gradually increase from the substrate SUB toward the emission layer EML. Thus, an energy barrier similar to that of the general device is not present in the anode AND, or an energy barrier lower than the energy barrier of the general device is present according to an example embodiment. Therefore, holes may be easily injected into the emission layer EML. In an example embodiment, the anode AND has substantially the same function as the anode AND and the hole injection layer of the general display.

As described above, the emission efficiency of the organic light emitting device according to an example embodiment may be increased by surface Plasmon effect through using the metal nanoparticles. In addition, the efficiency of the organic light emitting device such as current efficiency and/or power efficiency may be optimized by using a mixture of the fluoropolymer and the conductive polymer having high ionization energy of high work function in the anode AND. In an example embodiment, the anode AND formed by using the fluoropolymer and the conductive polymer functions as the hole injection layer. A separate hole injection layer may not be used, and the manufacturing process may be simplified.

According to an example embodiment, a flexible and conductive polymer is used as a material of the anode AND in the organic light emitting device. Thus, defects may be decreased when compared to a case using a general non-flexible and transparent metal oxide. For example, defects of the nonflexible and transparent metal oxide concerning fragility with respect to external impact may be mitigated or eliminated.

Hereinafter, example embodiments will be explained mainly with respect to the difference from above to avoid repetition of explanation.

In the following, metal nanoparticles are not particularly explained; however the metal nanoparticles may be homogeneously dispersed in the anode or may be provided mainly at the interface far from the emission layer in the anode, as described above.

Figure 3:
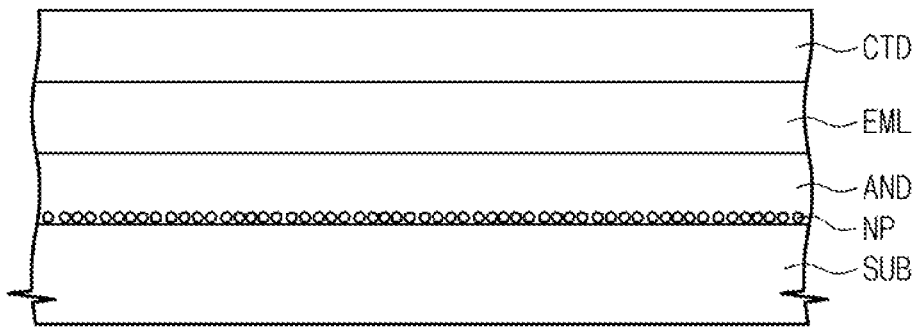
FIG. 3 illustrates a cross-sectional view of an organic light emitting device according to another example embodiment.

FIG. 3 illustrates a cross-sectional view of an organic light emitting device according to another example embodiment.

Referring to FIG. 3, in the present example embodiment the anode AND includes a conductive polymer, a fluoropolymer, and metal nanoparticles NP. The metal nanoparticles NP may not be homogeneously dispersed in the anode AND but may be provided at one side of the anode AND, particularly at one side far from the emission layer EML. In other words, the metal nanoparticles NP are provided so as to make contact with the interface with the anode AND far from the emission layer EML.

Through positioning the metal nanoparticles NP as far as possible from the emission layer EML, the recombination of holes and electrons in the anode AND (substantially in a hole injection layer) by the metal nanoparticles NP may be prevented.

The anode AND in the organic light emitting device having the above-described structure may be formed by applying the metal nanoparticles NP on the substrate SUB first, applying a mixture solution of the conductive polymer and the fluoropolymer on the substrate SUB, and performing the micro-phase separation of the conductive polymer and the fluoropolymer.

Figure 4:
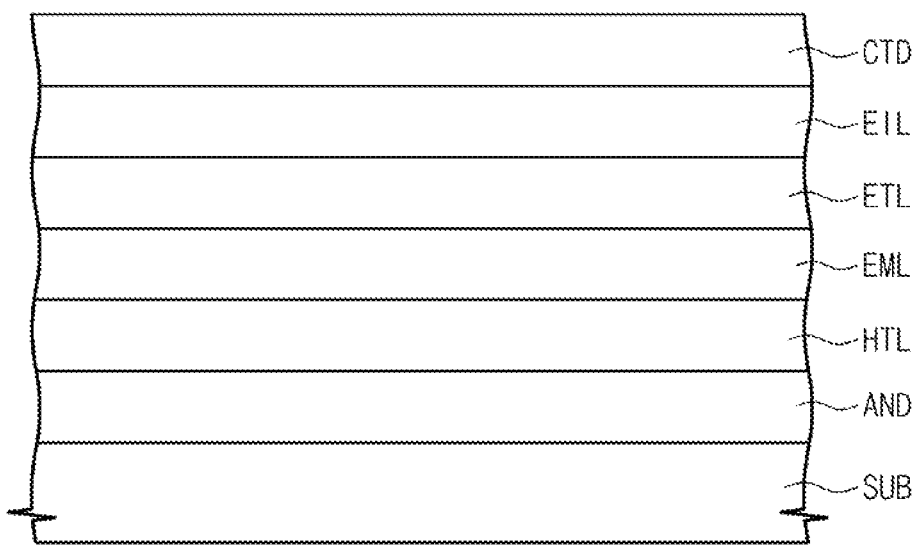
FIG. 4 illustrates a cross-sectional view of an organic light emitting device according to another example embodiment.

FIG. 4 illustrates a cross-sectional view of an organic light emitting device according to another example embodiment.

According to an example embodiment, various functional layers may be added between an anode AND and an emission layer EML, and between an emission layer EML and a cathode CTD.

Referring to FIG. 4, an organic light emitting device according to the present example embodiment includes a substrate SUB, and an anode AND, a hole transport layer HTL, an emission layer EML, an electron transport layer ETL, an electron injection layer EIL, and a cathode sequentially stacked on the substrate SUB. The hole transport layer HTL, the electron transport layer ETL, and the electron injection layer EIL may be formed, or one layer or two layers thereof may be omitted. For example, only the electron transport layer ETL and the electron injection layer EIL may be provided between the emission layer EML and the cathode CTD without the hole transport layer HTL. Alternatively, only the hole transport layer HTL and the electron transport layer ETL may be provided without the electron injection layer EIL.

The hole transport layer HTL may include, for example, a carbazole derivative such as N-phenylcarbazole, polyvinylcarbazole, etc., a triphenylamine-based derivative such as N,N'-bis(3-methylphenyl)-N,N'-diphenyl-[1,1-biphenyl]-4,4'-diamine (TPD), etc., N,N'-di(1-naphthyl)-N,N'-diphenyl-benzidine (NPB), 4,4',4"-tris(N-carbazolyl)triphenylamine (TCTA), 4,4'-cyclohexylidene bis[N,N-bis(4-methylphenyl) benzenamine (TAPC), etc.

The thickness of the hole transport layer HTL may be from about 50 Å to about 1,000 Å, for example, from about 100 Å to about 800 Å. The hole transport layer HTL may be formed by a method such as a vacuum deposition method, a spin coating method, a cast method, an LB method, etc.

In the case that the hole transport layer HTL is formed by the vacuum deposition method, the deposition conditions may be dependent on the compound used as the material of the hole transport layer HTL, and the properties of the target hole transport layer HTL. For example, appropriate conditions may be selected from the deposition temperature from about 100° C. to about 500° C., the vacuum degree from about $10^{-8}$ torr to about $10^{-3}$ torr, and the deposition rate from about 0.01 Å/sec to about 100 Å/sec.

In the case that the hole transport layer HTL is formed by the spin coating method, the coating conditions may be dependent on the compound used as the material of the hole transport layer HTL, and the properties of the target hole transport layer HTL. For example, appropriate conditions may be selected from the coating rate from about 2,000 rpm to about 5,000 rpm, and the heat treatment temperature for removing solvents after coating from about 80° C. to about 200° C.

The electron transport layer ETL may include a material such as tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), etc.

The thickness of the electron transport layer ETL may be from about 200 Å to about 400 Å, or from about 250 Å to about 350 Å.

The electron transport layer ETL may be formed by a vacuum deposition method, a spin coating method, a cast method, or an LB method. In an example embodiment, in the case that the electron transport layer ETL is formed by the vacuum deposition method and the spin coating method, deposition conditions and coating conditions may be dependent on the compounds used, and the electron transport layer ETL may be formed by conducting substantially the same method as that for forming the hole transport layer HTL.

The electron injection layer EIL may be provided on the surface of the electron transport layer ETL and may be formed by using a metal-containing material. The metal-containing material may be LiF, lithium quinolate (LiQ), $Li_2O$, BaO, NaCl, CsF, etc. The electron injection layer EIL may be formed on the surface of the electron transport layer ETL by vacuum thermal depositing or spin coating an electron injection material by means of a common method. The electron injection layer EIL may be also formed by using a mixed material of an electron transport material and an insulating organo metal salt. The organo metal salt may be a material having an energy band gap of at least about 4 eV. Particularly, the organo metal salt may include, for example, a metal acetate, a metal benzoate, a metal acetoacetate, a metal acetylacetonate, or a metal stearate.

In the organic light emitting device having the above-described structure, the injection and the transportation of electrons and holes into the emission layer EML may be stably conducted, thereby increasing emission efficiency.

Figure 5:
FIG. 5 illustrates a cross-sectional view of an organic light emitting device according to another example embodiment.
Figure 6A:
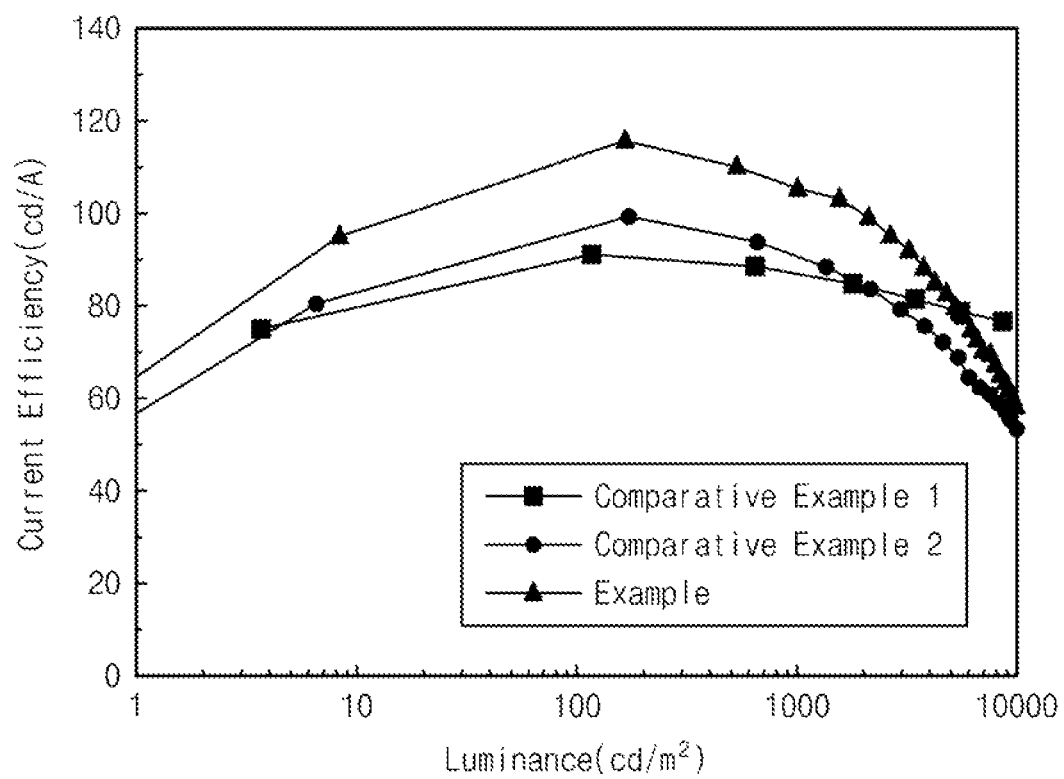
FIGS. 6A to 6D illustrate graphs of current efficiency with respect to luminance, power efficiency with respect to luminance, luminance with respect to voltage, and luminance with respect to current density in a general organic light emitting device and an organic light emitting device according to an example embodiment.
Figure 6B:
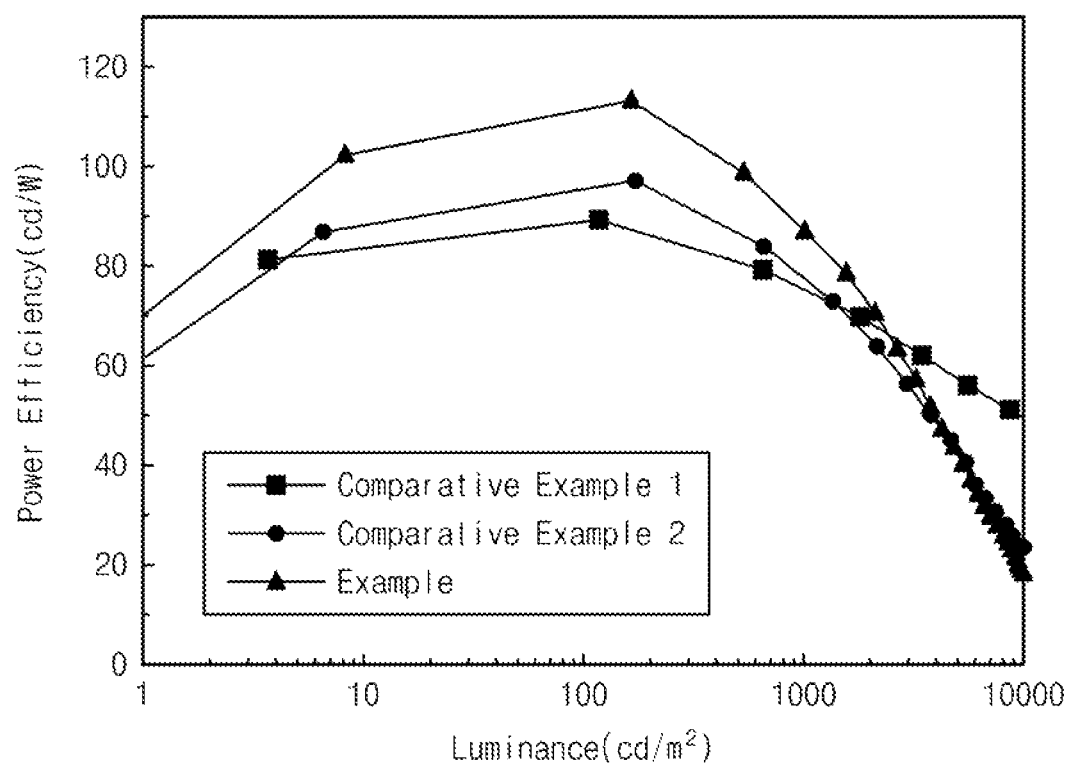
Figure 6C:
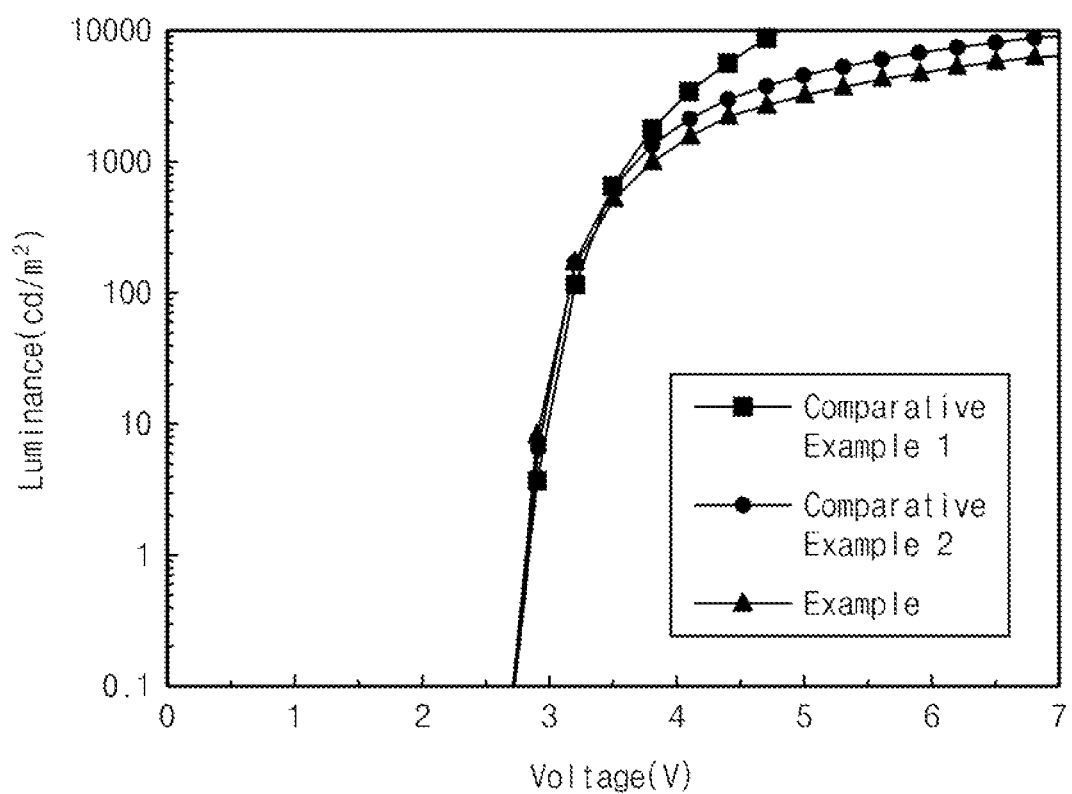
Figure 6D:
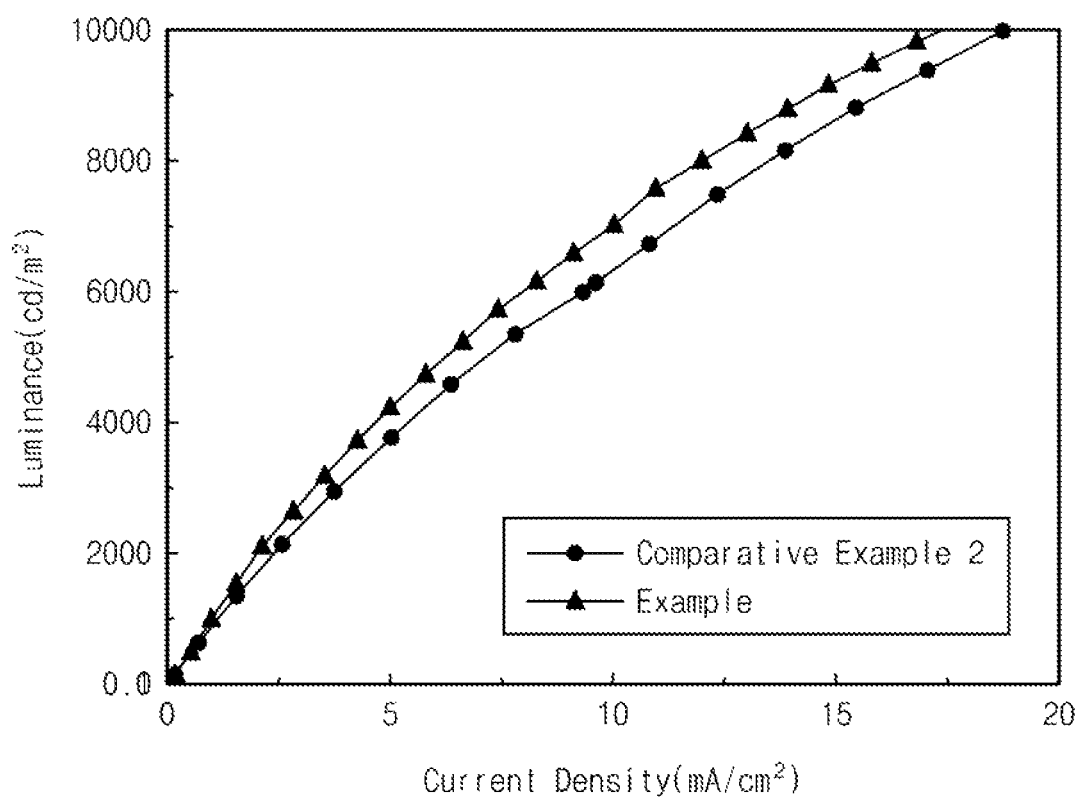

FIG. 5 illustrates a cross-sectional view of an organic light emitting device according to another example embodiment.

Referring to FIG. 5, according to the present example embodiment, an anode AND includes an electrode part ANDP including a transparent conductive material, and a hole injection part HILP provided between the electrode part ANDP and an emission layer EML. That is, in the above-described embodiments, the anode AND functions as an electrode and a hole injection layer at the same time, whereas, in this embodiment, a layer functioning as an electrode, i.e., the electrode part ANDP is additionally formed.

The electrode part ANDP may be formed by using, for example, indium tin oxide (ITO), indium zinc oxide (IZO), zinc oxide (ZnO), indium tin zinc oxide (ITZO), etc., and may be formed prior to forming the hole injection part HILP by a coating method or a deposition method.

The hole injection part HILP may include the conductive polymer, the fluoropolymer, and the metal nanoparticles. The metal nanoparticles may homogeneously dispersed in the hole injection part HILP or provided at the interface side of the hole injection part HILP far from the emission layer EML.

According to the present example embodiment, a flexible and conductive polymer is used in the hole injection part HILP, and defects possibly generated in the transparent metal oxide may be avoided.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

FIGS. 6A to 6D illustrate graphs of current efficiency with respect to luminance, power efficiency with respect to luminance, luminance with respect to voltage, and luminance with respect to current density in a general organic light emitting device and an organic light emitting device according to an example embodiment.

Figure 7A:
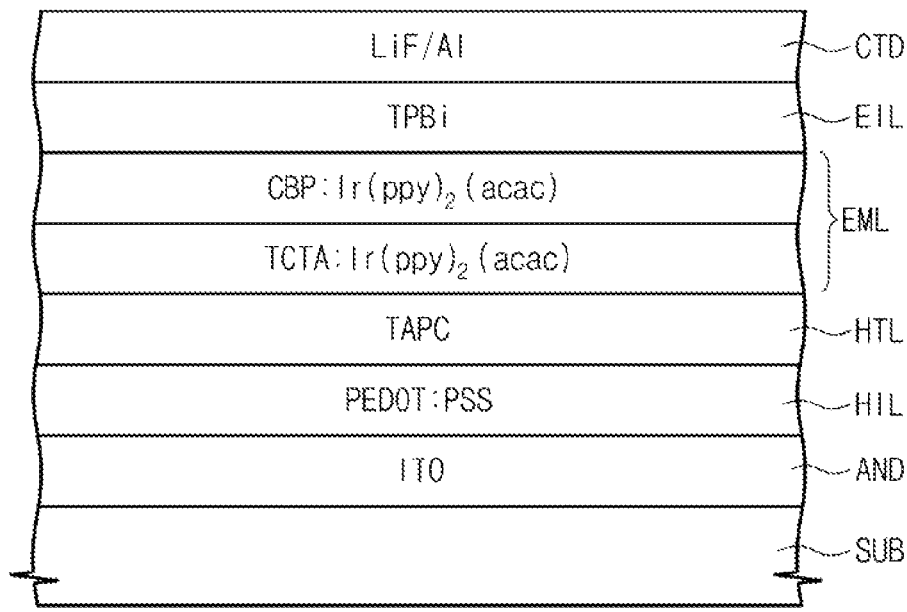
FIG. 7A illustrates an organic light emitting device according to Comparative Example 1.
Figure 7B:
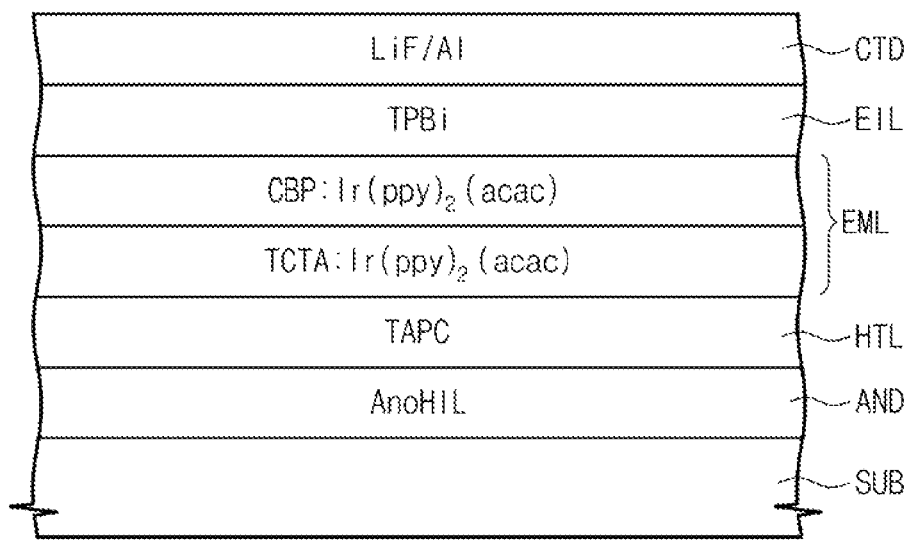
FIG. 7B illustrates an organic light emitting device according to Comparative Example 2 and an Example.

In each of the graphs, the results of Comparative Example 1 were obtained with respect to an organic light emitting device having a structure in FIG. 7A. The results of Comparative Example 2 were obtained with respect to an organic light emitting device having a structure in FIG. 7B.

In Comparative Example 1, the anode was formed using ITO, and the hole injection layer was formed using PEDOT:PSS.

In Comparative Example 2 and the Example, the anode was formed to include the conductive polymer and the fluoropolymer. The conductive polymer used was PEDOT:PSS, and the fluoropolymer was a compound having the following Formula 5 (where x is from 0 to 10,000,000, y is from 1 to 10, 000,000, and z is from 0 to 20). Symbol AnoHIL in FIG. 7B means PEDTO:PSS and the compound of Formula 5.

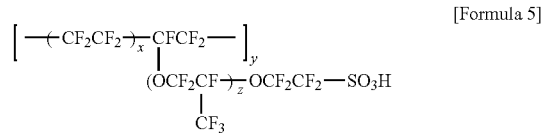

[Formula 5]

However, the metal nanoparticles are not included in the anode in Comparative Example 2, and the metal nanoparticles (silver nanoparticles in this Example) are included in the anode as a layer at the interface of the anode contacting the substrate in the Example.

In Comparative Example 1, Comparative Example 2, and the Example, all parts except for the anode were formed as the same structure using the same materials. That is, the hole transport layer was formed using TAPC, the emission layer was formed using TCTA:Ir(ppy)$_2$(acac) and CBP:IR(ppy)$_2$(acac), the electron injection layer was formed using TPBi, and the cathode was formed using LiF/Al.

Referring to FIGS. 6A to 6D, the current efficiency with respect to luminance, the power efficiency with respect to luminance, the luminance with respect to voltage, and the luminance with respect to current density of the organic light emitting device including the silver nanoparticles according to an example embodiment are markedly higher than those of the organic light emitting devices according to Comparative Example 1 and Comparative Example 2. Particularly, with respect to the current density, the current densities are about 91.1 cd/A and about 99.2 cd/A for the organic light emitting devices according to Comparative Examples 1 and 2, and about 115 cd/A for the organic light emitting device according to the Example. The current efficiency is confirmed to be largely increased in the organic light emitting device according to the Example. In addition, with respect to the power efficiency, the power efficiencies are about 89.5 lm/W and about 97.4 lm/W for the organic light emitting devices according to Comparative Examples 1 and 2, and about 113.3 lm/W for the organic light emitting device according to the Example. The power efficiency is confirmed to be largely increased in the organic light emitting device according to the Example.

The organic light emitting device having the above-described structure may be used in various electronic devices, for example, lighting instruments or display apparatuses.

Hereinafter, a display device employing the organic light emitting device according to an example embodiment will be explained referring to FIGS. 8 to 10.

Figure 8:
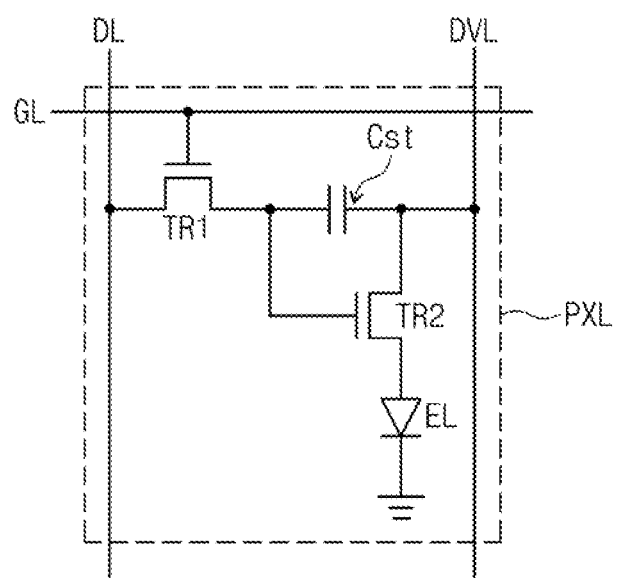
FIG. 8 illustrates a circuit diagram of a pixel when an organic light emitting device according to an example embodiment is applied in a display device.
Figure 9:
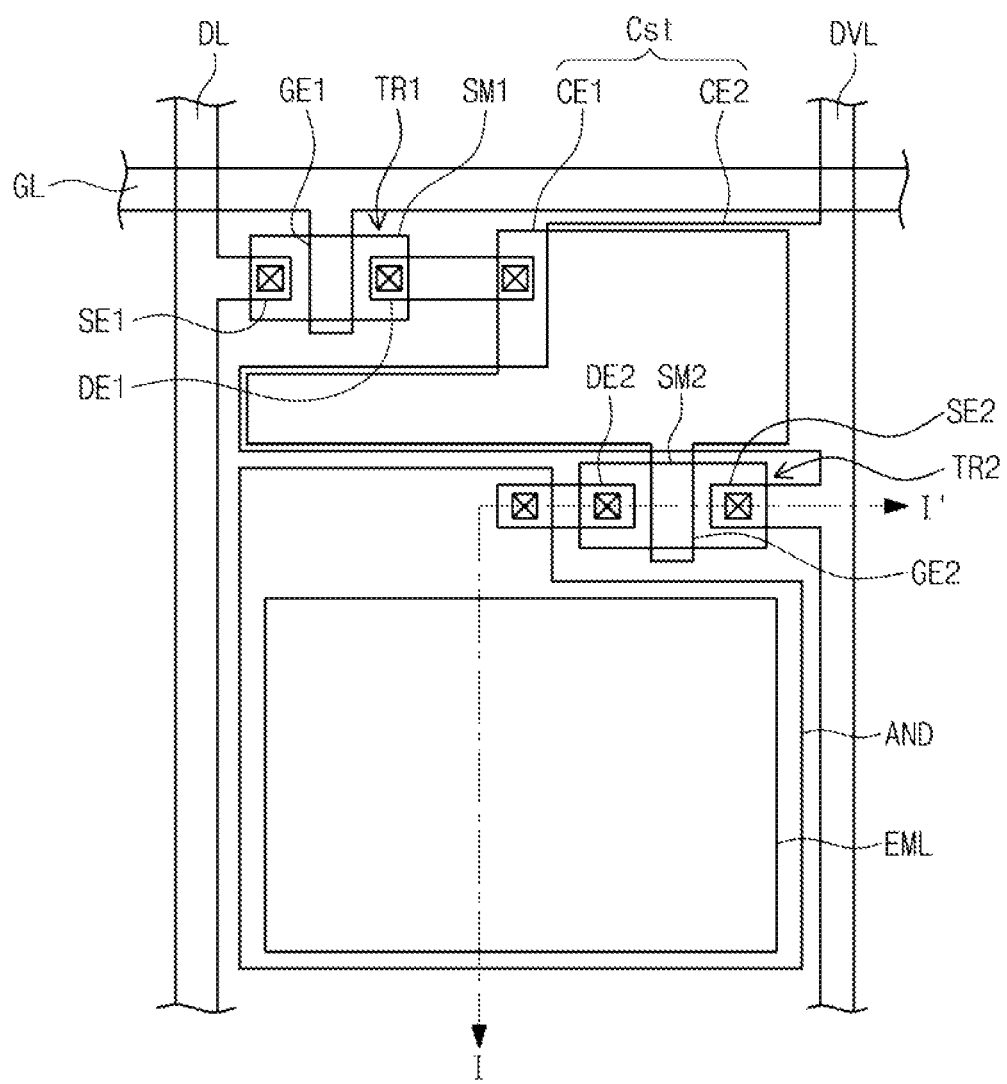
FIG. 9 illustrates a plan view of the pixel illustrated in FIG. 8.
Figure 10:
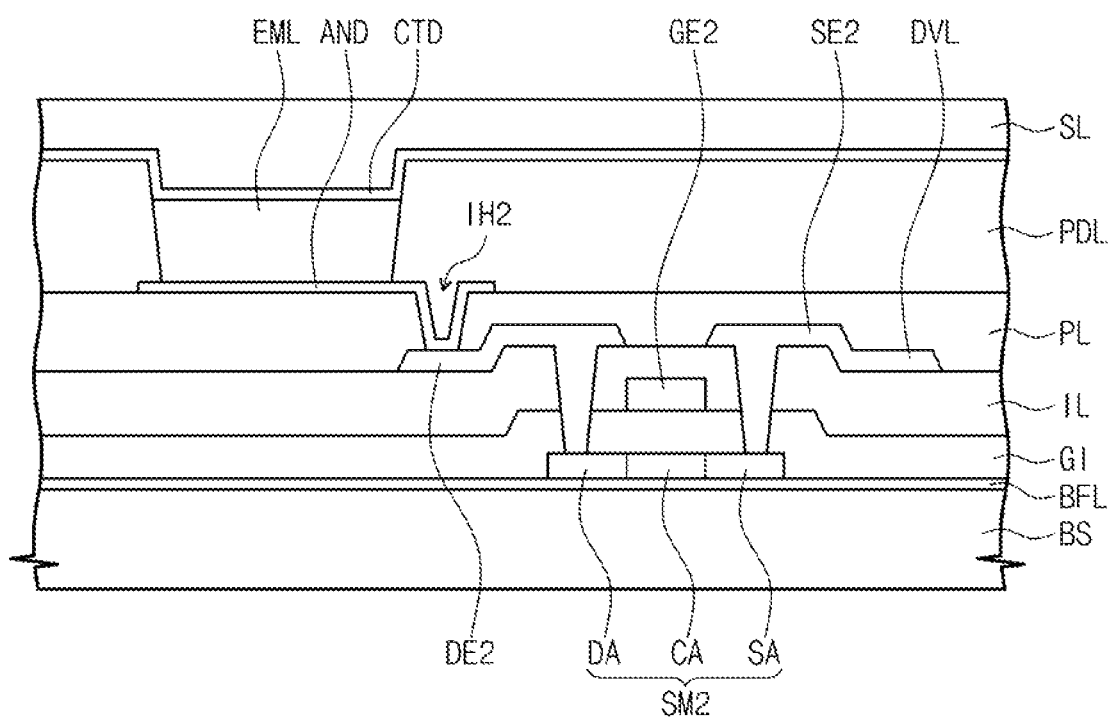
FIG. 10 illustrates a cross-sectional view taken along line I-I' in FIG. 9.

FIG. 8 illustrates a circuit diagram of a pixel when an organic light emitting device according to an example embodiment is applied in a display device, FIG. 9 is a plan view of the pixel in FIG. 8, and FIG. 10 is a cross-sectional view taken along line I-I' of FIG. 9.

A display device according to an example embodiment includes at least one pixel PXL provided with images. A plurality of the pixels PXL may be provided and arranged in a matrix shape, however only one pixel PXL is illustrated in this embodiment for convenience of explanation.

The pixel PXL includes a line part including a gate line GL, a data line DL, and a driving voltage line DVL, a thin film transistor connected to the line part, an organic light emitting device connected to the thin film transistor, and a capacitor Cst.

The gate line GL extends in one direction. The data line DL extends in another direction crossing the gate line GL. The driving voltage line DVL extends in substantially the same direction as the data line DL. The gate line GL transmits scanning signals to the thin film transistor, the data line DL transmits data signals to the thin film transistor, and the driving voltage line DVL provides a driving voltage to the thin film transistor.

The thin film transistor may include a driving thin film transistor TR2 for controlling the organic light emitting device, and a switching thin film transistor TR1 for switching the driving thin film transistor TR2. In an example embodiment, one pixel PXL includes two thin film transistors TR1 and TR2, etc. One pixel PXL may be provided with one thin film transistor and one capacitor, or one pixel PXL may be provided with at least three thin film transistors and at least two capacitors.

The switching thin film transistor TR1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to the gate electrode (that is, a second gate electrode GE2) of the driving thin film transistor TR2. The switching thin film transistor TR1 transmits data signals applied to the data line DL according to the scanning signals applied to the gate line GL to the driving thin film transistor TR2.

The driving thin film transistor TR2 includes a second gate electrode GE2, a second source electrode SE2, and a second drain electrode DE2. The second gate electrode GE2 is connected to the switching thin film transistor TR1, the second source electrode SE2 is connected to the driving voltage line DVL, and the second drain electrode DE2 is connected to the organic light emitting device.

The organic light emitting device includes an emission layer EML, and an anode AND and a cathode CTD facing to each other with the emission layer EML therebetween. The anode AND is connected to the second drain electrode DE2 of the driving thin film transistor TR2. A common voltage is applied to the cathode CTD, and the emission layer EML emits light according to the output signals of the driving thin film transistor TR2 and displays images.

The capacitor Cst is connected between the second gate electrode GE2 and the second source electrode SE2 of the driving thin film transistor TR2, and charges and maintains data signals inputted to the second gate electrode GE2 of the driving thin film transistor TR2.

Hereinafter, the display device according to an example embodiment will be explained according to the stacking order.

The display device according to an example embodiment includes an insulating base substrate BS of glass, plastic, crystal, etc., on which a thin film transistor and an organic light emitting device are stacked.

On the base substrate BS, a buffer layer BFL is formed. The buffer layer BFL prevents the diffusion of impurities into switching and driving thin film transistors TR1 and TR2. The buffer layer BFL may be formed by using silicon nitride (SiNx), silicon oxide (SiOx), silicon oxynitride (SiOxNy), etc. and may be omitted according to the material of the base substrate BS and process conditions.

On the buffer layer BFL, a first semiconductor layer SM1 and a second semiconductor layer SM2 are provided. The first semiconductor layer SM1 and the second semiconductor layer SM2 are formed by using a semiconductor material, and are operated as an active layer of a switching thin film transistor TR1 and a driving thin film transistor TR2, respectively. Each of the first semiconductor layer SM1 and the second semiconductor layer SM2 includes a source area SA, a drain area DA, and a channel area CA provided between the source area SA and the drain area DA. Each of the first semiconductor layer SM1 and the second semiconductor layer SM2 may be formed by selecting from an inorganic semiconductor or an organic semiconductor. The source area SA and the drain area DA may be doped with n-type impurities or p-type impurities.

On the first semiconductor layer SM1 and the second semiconductor layer SM2, a gate insulating layer GI is provided.

On the gate insulating layer GI, a first gate electrode GE1 and a second gate electrode GE2 connected to the gate line GL are provided. Each of the first gate electrode GE1 and the second gate electrode GE2 is formed to cover an area corresponding to the channel area CA of each of the first semiconductor layer SM1 and the second semiconductor layer SM2.

On the first and second gate electrodes GE1 and GE2, an interlayer dielectric IL covering the first and second gate electrodes GE1 and GE2 is provided.

On the interlayer dielectric IL, a first source electrode SE1, a first drain electrode DE1, a second source electrode SE2 and a second drain electrode DE2 are provided. The first source electrode SE1 and the first drain electrode DE1 make contact with the source area SA and the drain area DA of the first semiconductor layer SM1, respectively, through contact holes formed in the gate insulating layer GI and the interlayer dielectric IL. The second source electrode SE2 and the second drain electrode DE2 make contact with the source area SA and the drain area DA of the second semiconductor layer SM2, respectively, through contact holes formed in the gate insulating layer GI and the interlayer dielectric IL.

On the first source electrode SE1, the first drain electrode DE1, the second source electrode SE2 and the second drain electrode DE2, a passivation layer PL is provided. The passivation layer PL may play the role of a passivation layer passivating the switching and driving thin film transistors TR1 and TR2 and may play the role of a planarization layer planarizing the top surface thereof.

On the passivation layer PL, an anode AND is provided as an anode of the organic light emitting device. The anode AND is connected to the second drain electrode DE2 of the driving thin film transistor TR2 through a contact hole formed in the passivation layer PL.

On the base substrate BS on which the anode AND, etc. are formed, a pixel defining layer PDL dividing pixel areas PA so as to correspond to each pixel is provided. The pixel defining layer PDL exposes the top surface of the anode AND and is extruded from the base substrate BS along the circumference of the pixel.

In the pixel area PA surrounded by the pixel defining layer PDL, an emission layer EML is provided, and a cathode CTD is provided on the emission layer EML.

On the cathode CTD, a sealing layer SL covering the cathode CTD is provided.

The organic light emitting device manufactured by the above-described method may function as a display device displaying images through the recognition of emitted light from the organic emission layer by a user.

As described above, embodiments may provide an organic light emitting device with high quality and a manufacturing method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
   an anode, the anode including a conductive polymer, a fluorine-containing organic material, and metal nanoparticles;
   a cathode facing the anode; and
   an emission layer between the anode and the cathode, wherein:
   concentration of the fluorine-containing organic material in the anode increases toward the emission layer.

2. The organic light emitting device as claimed in claim 1, wherein the fluorine-containing organic material includes a moiety represented by the following Formula 1:

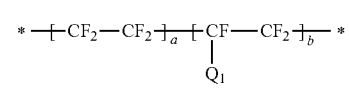

[Formula 1]

wherein:
a is a number from 0 to 10,000,000;
b is a number from 1 to 10,000,000;
$Q_1$ is $[O-C(R_1)(R_2)-C(R_3)(R_4)]_c-[OCF_2CF_2]_d-R_5$, —COOH, or —O—$R_f$—$R_6$;
$R_1$, $R_2$, $R_3$, and $R_4$ are independently —F, —$CF_3$, —$CHF_2$, or —$CH_2F$;
c and d are independently a number from 0 to 20;
$R_f$ is —$(CF_2)_z$— (where z is an integer from 1 to 50) or —$(CF_2CF_2O)_z$—$CF_2CF_2$— (where z is an integer from 1 to 50);
$R_5$ and $R_6$ are independently —$SO_3M$, —$PO_3M$, or —$CO_2M$; and
M represents $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

3. The organic light emitting device as claimed in claim 1, wherein the fluorine-containing organic material includes a moiety represented by the following Formula 2:

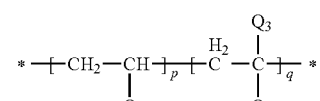

[Formula 2]

wherein:
p is a number from 0 to 10,000,000;
q is a number from 1 to 10,000,000;
$Q_2$ is hydrogen, a substituted or unsubstituted $C_6$-$C_{60}$ aryl group, or —COOH;
$Q_3$ is hydrogen, or a substituted or unsubstituted $C_1$-$C_{20}$ alkyl group;
$Q_4$ is —O—$(CF_2)_r$—$SO_3M$, —O—$(CF_2)_r$—$PO_3M_2$, —O—$(CF_2)_r$—$CO_2M$, or —CO—NH—$(CH_2)_s$—$(CF_2)_t$—$CF_3$;
r, s, and t are independently a number from 0 to 20; and
M represents $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

4. The organic light emitting device as claimed in claim 1, wherein the fluorine-containing organic material includes a moiety represented by the following Formula 3:

[Formula 3]

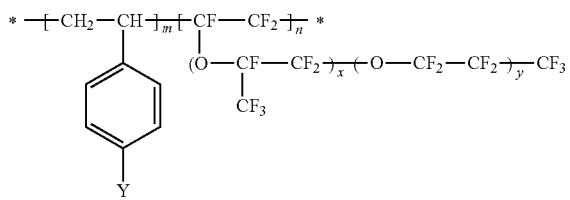

wherein:
m is a number from 0 to 10,000,000;
n is a number from 1 to 10,000,000;
x is a number from 0 to 20;
y is a number from 0 to 20;
Y is $-SO_3M$, $-PO_3M$, or $-CO_2M$; and
M represents $Na^+$, $K^+$, $Li^+$, $H^+$, $CH_3(CH_2)_wNH_3^+$ (where w is an integer from 0 to 50), $NH_4^+$, $NH_2^+$, $NHSO_2CF_3^+$, $CHO^+$, $C_2H_5OH^+$, $CH_3OH^+$, or $CH_3(CH_2)_wCHO^+$ (where w is an integer from 0 to 50).

5. The organic light emitting device as claimed in claim 1, wherein the fluorine-containing organic material is represented by the following Formula 4:

$$X\text{-}M^f_n\text{-}M^h_m\text{-}M^a_r\text{-}(G)_p$$ [Formula 4]

wherein:
X is a terminal group;
$M^f$ represents a unit derived from a fluorinated monomer obtained through condensation reaction of perfluoropolyether alcohol, polyisocyanate, and isocyanate reactive-non-fluorinated monomer, or a fluorinated $C_{1-20}$ alkylene group;
$M^h$ represents a unit derived from a non-fluorinated monomer;
$M^a$ represents a unit having a silyl group represented by $-Si(Y_4)(Y_5)(Y_6)$;
$Y_4$, $Y_5$, and $Y_6$ are independently a halogen atom, a substituted or unsubstituted $C_1$-$C_{20}$ alkyl group, a substituted or unsubstituted $C_6$-$C_{30}$ aryl group, or a hydrolysable substituent, at least one of $Y_4$, $Y_5$, and $Y_6$ being the hydrolysable substituent;
G is an organic group including a chain transfer agent residue;
n is a number from 1 to 100;
m is a number from 1 to 100;
r is a number from 1 to 100; and
p is a number from 0 to 10.

6. The organic light emitting device as claimed in claim 1, wherein the conductive polymer includes one or more of polythiophene, polyaniline, polypyrrole, polystyrene, sulfonated polystyrene, poly(3,4-ethylenedioxythiophene), a self-doping conductive polymer, a derivative thereof, or a combination thereof.

7. The organic light emitting device as claimed in claim 6, wherein the metal nanoparticles are homogeneously dispersed in the anode.

8. The organic light emitting device as claimed in claim 6, wherein the metal nanoparticles are provided to make contact with an interface of the anode far from the emission layer.

9. The organic light emitting device as claimed in claim 6, wherein the metal nanoparticles include one or more of Au, Ag, Cu, Pt, Pd, Ru, or Re nanoparticles.

10. The organic light emitting device as claimed in claim 9, wherein the metal nanoparticles have a size from about 5 to about 50 nm.

11. The organic light emitting device as claimed in claim 9, wherein the metal nanoparticles have a sphere shape, a cube shape, a plate shape, or a cage shape.

12. The organic light emitting device as claimed in claim 1, wherein the anode includes:
an electrode part including a transparent conductive material; and
a hole injection part provided between the electrode part and the emission layer.

13. The organic light emitting device as claimed in claim 12, wherein the hole injection part includes the metal nanoparticles, the conductive polymer, and the fluorine-containing organic material.

14. The organic light emitting device as claimed in claim 13, wherein the metal nanoparticles are homogeneously dispersed in the hole injection part.

15. The organic light emitting device as claimed in claim 13, wherein the metal nanoparticles are provided at an interface of the hole injection part adjacent to the anode.

16. A manufacturing method of an organic light emitting device, the method comprising:
forming an anode including metal nanoparticles, a conductive polymer, and a fluorine-containing organic material on a substrate;
forming an emission layer on the anode; and
forming a cathode on the emission layer, wherein:
the forming of the anode includes:
applying a mixture solution that includes the metal nanoparticles, the conductive polymer, and the fluorine-containing organic material on the substrate; and conducting micro-phase separation of the conductive polymer and the fluorine-containing organic material, or
applying the metal nanoparticles on the substrate; applying a mixture solution that includes the conductive polymer, and the fluorine-containing organic material on the substrate; and conducting micro-phase separation of the conductive polymer and the fluorine-containing organic material.

* * * * *

UNITED STATES PATENT AND TRADEMARK OFFICE
CERTIFICATE OF CORRECTION

PATENT NO. : 10,008,685 B2
APPLICATION NO. : 14/812493
DATED : June 26, 2018
INVENTOR(S) : Tae-Woo Lee et al.

It is certified that error appears in the above-identified patent and that said Letters Patent is hereby corrected as shown below:

On the Title Page

Item (73) Assignees:
Replace:
"Samsung Dispaly Co., Ltd., Yongin, Gyeonggi-do (KR);
Postech Academy-Industry Foundation, Pohang-Si, Gyeongsangbuk-do (KR)"

With:
Samsung Display Co., Ltd., Yongin, Gyeonggi-do (KR);
Postech Academy-Industry Foundation, Pohang-Si, Gyeongsangbuk-do (KR)

Signed and Sealed this
Sixteenth Day of October, 2018

Andrei Iancu
*Director of the United States Patent and Trademark Office*